United States Patent [19]
Chong et al.

[11] Patent Number: 5,699,613
[45] Date of Patent: Dec. 23, 1997

[54] FINE DIMENSION STACKED VIAS FOR A MULTIPLE LAYER CIRCUIT BOARD STRUCTURE

[75] Inventors: Ku Ho Chong, Arlington Heights, Ill.; Charles Hayden Crockett, Jr., Austin, Tex.; Stephen Alan Dunn, deceased, late of Georgetown, Tex., by Alice Catherine Dunn, independent administratrix; Karl Grant Hoebener, Georgetown, Tex.; Michael George McMaster, Vernonia, Oreg.

[73] Assignee: International Business Machines Corporation, Armonk, N.Y.

[21] Appl. No.: 533,035

[22] Filed: Sep. 25, 1995

[51] Int. Cl.⁶ .................................................. H05K 3/10
[52] U.S. Cl. ................................... 29/852; 29/830; 29/884; 174/264; 361/795; 427/97
[58] Field of Search .............................. 29/846, 851, 852, 29/830, 884; 174/258, 262, 263, 264; 361/790, 795; 427/96, 97, 98; 428/901

[56] References Cited

U.S. PATENT DOCUMENTS

| | | | |
|---|---|---|---|
| 4,673,773 | 6/1987 | Nakano et al. | 174/258 |
| 4,908,940 | 3/1990 | Amano et al. | 29/852 |
| 5,006,182 | 4/1991 | Gantzhorn, Jr. et al. | 29/851 X |
| 5,098,771 | 3/1992 | Friend . | |
| 5,123,849 | 6/1992 | Deak et al. . | |
| 5,129,142 | 7/1992 | Bindra et al. | 29/852 |
| 5,200,112 | 4/1993 | Angelopooulos et al. . | |
| 5,232,548 | 8/1993 | Ehrenberg et al. . | |
| 5,263,243 | 11/1993 | Taneda et al. | 29/830 |
| 5,300,402 | 4/1994 | Card, Jr. et al. . | |
| 5,327,013 | 7/1994 | Moore et al. . | |
| 5,346,558 | 9/1994 | Mathias . | |
| 5,376,403 | 12/1994 | Capote et al. . | |
| 5,378,402 | 1/1995 | Cross et al. . | |
| 5,487,218 | 1/1996 | Bhatt et al. | 29/852 |
| 5,509,203 | 4/1996 | Yamashita | 29/852 X |

FOREIGN PATENT DOCUMENTS

| | | | |
|---|---|---|---|
| 406164149 | 6/1994 | Japan | 29/852 |
| 40620664 | 7/1994 | Japan | 29/852 |

OTHER PUBLICATIONS

IBM Technical Disclosure Bulletin, vol. 36, No. 05, May 1993, "Method of Adding Devices to a Finished Circuit Card or Panel", p. 207.

IBM Technical Disclosure Bulletin, vol. 4, No. 2, Jul. 1961, "Solderable Contact Adhesive", pp. 15–16.

*VLSI Technology*, S. M. Sze, 1983, pp. 554–555.

*Primary Examiner*—Peter Vo
*Assistant Examiner*—Khan Nguyen
*Attorney, Agent, or Firm*—Casimer K. Salys

[57] ABSTRACT

A method of manufacturing a multiple layer circuit board with stacked vias of fine dimension and pitch. A base laminate with conductive pattern is coated with a dielectric which is photolithographically processed to create holes exposing selected regions of the underlying conductive pattern. The holes through the dielectric are plated to form via connections between the surface and the conductive pattern on the base laminate. The recess created by the via is filled with a conductive and plateable polymer which upon curing forms a conductive plug. A second dielectric layer is deposited on the board structure and in succession photolithographically processed to expose the underlying plated via and plug. The hole in the second dielectric is plated and filled with conductive polymer so as to create a second via vertically aligned with and electrically connected to the underlying first via. The ability to form fine pitch stacked vias is particularly important for printed circuit board structures such as carriers of flip chip die, in that the fine pitch of the solder ball array of the flip chip needs to be expanded and/or disbursed through multiple board layers with minimum area and electrical degradation.

10 Claims, 8 Drawing Sheets

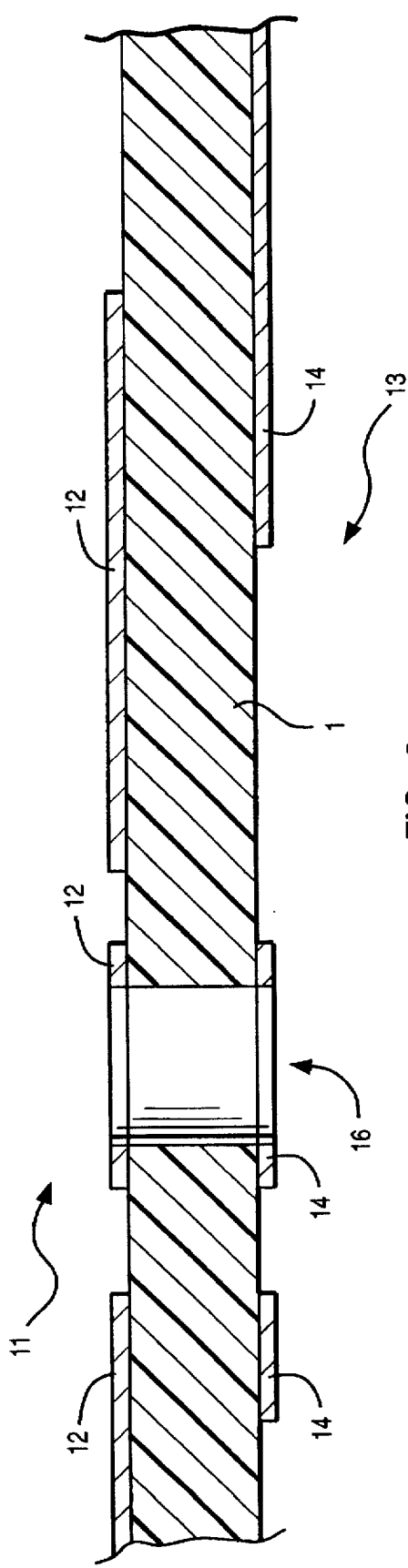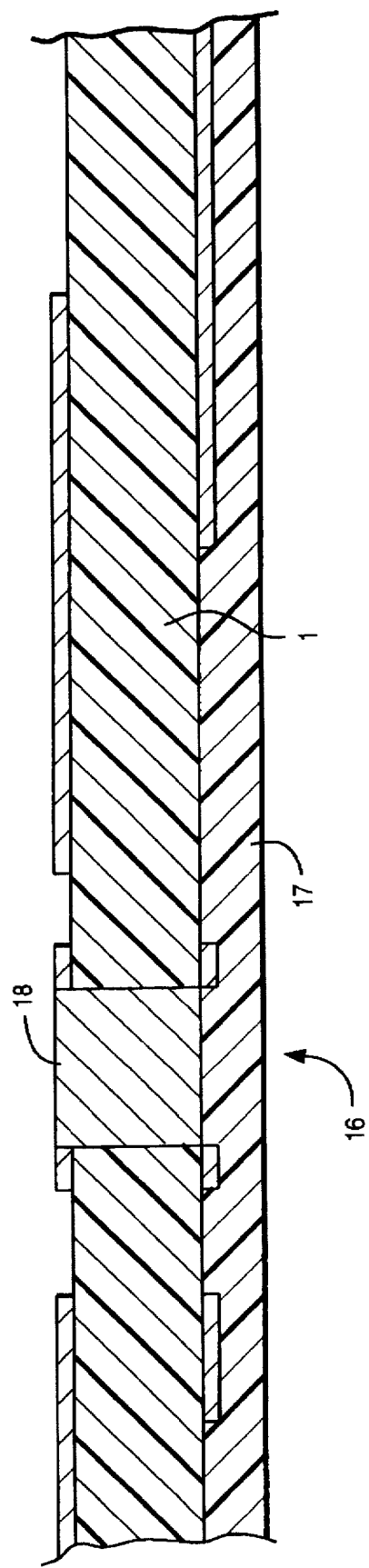

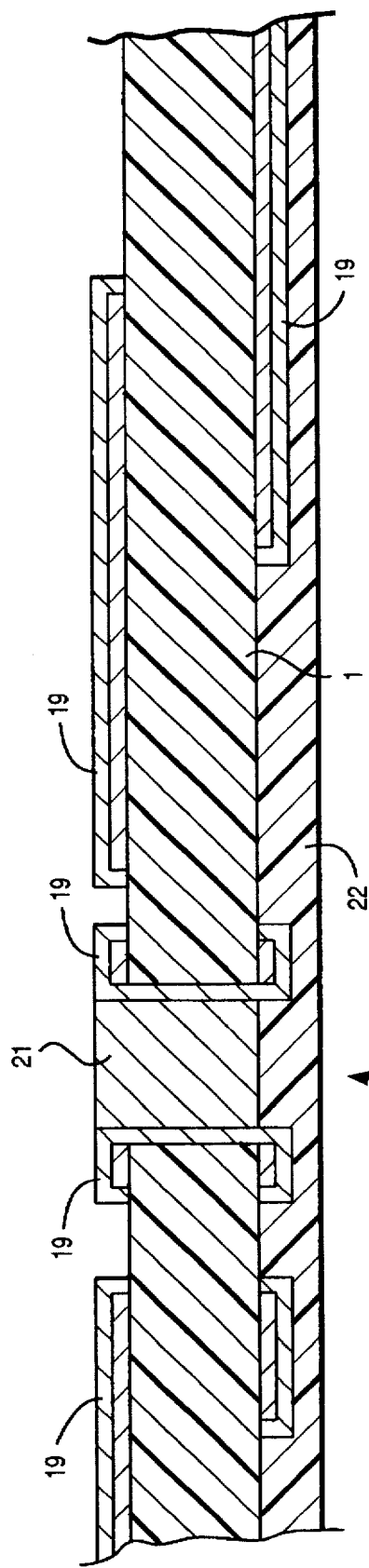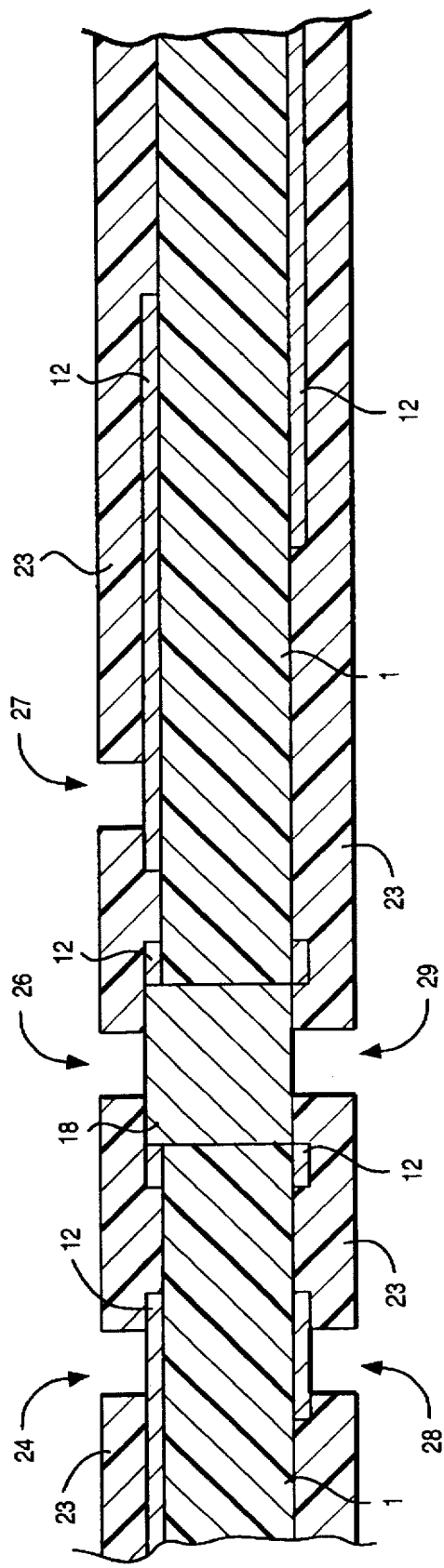
FIG. 3B
FIG. 4

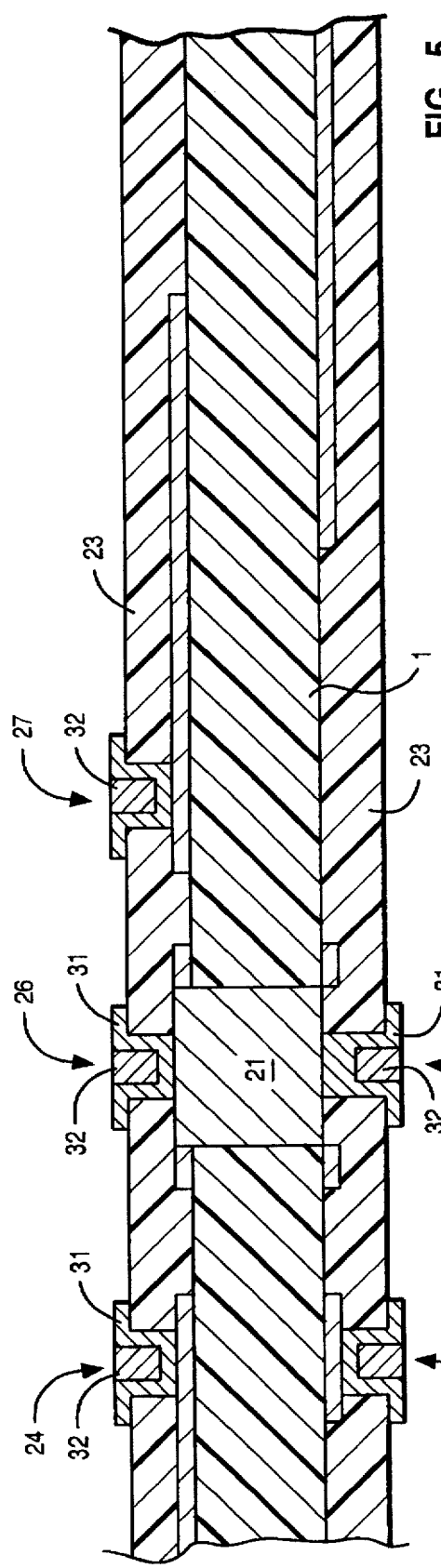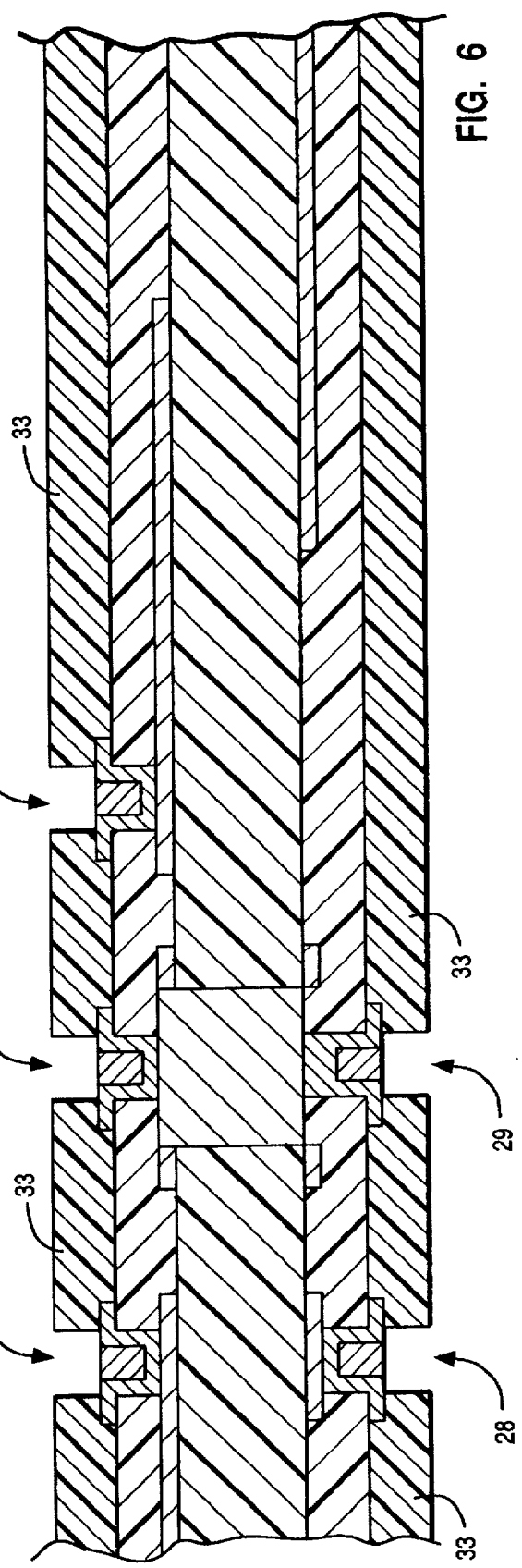

FINE DIMENSION STACKED VIAS FOR A MULTIPLE LAYER CIRCUIT BOARD STRUCTURE

BACKGROUND OF THE INVENTION

The present invention relates generally to the structure and manufacture of electronic printed circuit boards. More particularly, the invention is directed to the formation of vies in multiple layer high density printed circuit boards.

Electronic circuit board interconnect technology tends to fall into three classes. The first is that represented by printed circuit boards composed of laminated epoxy filled cloth. The individual layers have electronically conductive paths of patterned copper. The second, and relatively new class of printed circuit board designs, employs only a base structure of epoxy filled cloth. This base is covered with multiple layers of photoimageable dielectric and patterned copper. The last, and somewhat more exotic structure, is composed of multiple layers of laminated ceramic with individually patterned copper.

The present invention is directed to the formation of vies in the context of the second general structure. However, the underlying concepts are potentially applicable to the other structures where such board structures use layers of photoimageable dielectric and patterned copper.

Electrical interconnection between the conductive patterns in the various layers of multilayer boards is accomplished through vies. The formation of the vias differs depending on the technology of the printed circuit board. In the case of the multiple layer epoxy filled cloth structure, the first noted hereinbefore, vias are formed by drilling holes and plating the paths through the holes. The via holes can extend through the complete multilayer board, in which case the vias and the electrical interconnections joint intersected copper patterns in each of the layers, or can extend only part way through the structure. In the latter case the blind vias formed only interconnect copper in the board layers actually penetrated. With the pursuit of smaller circuit board dimensions, hole diameters have decreased to 0.2 millimeters. Unfortunately, such diameters approach the limits of hole drilling technology.

The practice of using photoimageable dielectric and plated copper to form successive layers onto an epoxy filled cloth structure base or core structure allows the mixed practice of using both conventionally drilled holes as well as photoimage generated via structures. Photoimage generated vias typically have a diameters of 0.12 millimeters, providing a nominal factor of two diameter reduction over drilled holes. The thickness of a photoimage dielectric layers nominally ranges from 0.05 to 0.1 millimeters.

Reliable plating into small diameter holes is a subject of significant concern. In particular, stacked vias, namely those aligned vertically along the Z axis of a board through multiple dielectric layers, do not exhibited good plating at the small hole diameters attainable with photoimageable dielectric layers. In general, the higher the aspect ratio of the composite multiple layer stacked via hole, the poorer the plating quality at the deepest penetration of the via hole.

To overcome the stacked via limitation in circuit board structures using multiple photoimageable dielectric layers, via locations are staggered from layer to layer. Unfortunately, such staggering consumes valuable board area, increases the signal run length and produces an associated decrease in circuit performance.

Though stacked vias can be formed in ceramic printed circuit board structures, multilayer ceramic boards lie at the very expensive end of the circuit board cost spectrum.

What is needed is a method and structure which provides stacked vies suitable for multiple layer photoimage dielectric printed circuit board structures with via diameters nominally 0.12 millimeters or less. Stacked vies in that context would provide layer to layer signal paths without loss of valuable board area and permit direct ground and power supply transmission between the successive layers of multilayer boards, in the sense of defining a stacked circuit architecture.

SUMMARY OF THE INVENTION

The formation of stacked vies in the context of small dimension photoimage formed via holes is accomplished through the practice of the present invention. In one form, the invention is directed to a method of manufacturing a multiple layer circuit board with stacked vias through the steps of forming a first electric interconnect pattern on the front side of the base laminate, forming a layer of first dielectric on the front side of the base laminate, selectively removing regions of first dielectric layer to exposed first electrical interconnect pattern regions through the first dielectric layer, plating to form first vies at selectively removed regions, filling first vias with first conductive polymer, curing the first conductive polymer to form first plugs within the first vias, forming a layer of second dielectric on the front side of the base laminate, selectively removing regions of the second dielectric layer to expose select conductive plug filled first vias through the second dielectric layer, plating to form second vias at selectively removed regions, filling second vias with second conductive polymer, and curing the second conductive polymer to form second plugs within the second vias aligned with and electrically connected to underlying first vias.

In another form, the invention defines a method for creating reliable electrical connections through stacked via structures in the context of via hole plating performed on small dimension photoimage formed via holes. The concepts of the invention also extend to combinations in which the photoimage formed vias are electrically connected through stacked alignment with plated through hole vias or blind hole vias as conventionally formed in laminated epoxy type printed circuit boards.

A key aspect of the invention involves the combination of plating to deposit electrically conducted metal into small dimension photoimage generated via holes in combination with the filling of such vias with a conductive, plateable and solderable polymer. The conductive polymer insures that each successive layer in a stacked via structure has a reliable electrical connection to the full surface area of the underlying via structure. Since the fundamental concept of conductively filled vias is applicable not only to photoimage dimensioned vias but conventional drilled vias, the practice of the invention facilitates via stacking within the context of photoimage formed vias as well as between photoimage formed vias and drilled vias.

In e still further form, the invention relates to the structure of a flip chip die carrier. The carrier structurally supports the die and electrically interfaces the die solder ball pattern to a ball grid array solder ball pattern.

These end other features of the invention will be more clearly understood and appreciated upon considering the detailed embodiment which follows.

BRIEF DESCRIPTION OF THE DRAWINGS

FIG. 2 shows by schematic cross section a laminated epoxy core structure for the board of the present invention.

FIGS. 3A and 3B illustrate different techniques for forming conductive vias through the core structure of the board FIG. 2.

FIG. 4 illustrates by schematic cross section the formation of photoimageable holes in preparation for electrically conductive via creation.

FIGS. 5, 6 and 7 illustrate by schematic cross section the formation of plated and conductive polymer filled vias in stacked alignment on the core board structure.

DESCRIPTION OF THE PREFERRED EMBODIMENT

Figure 1:
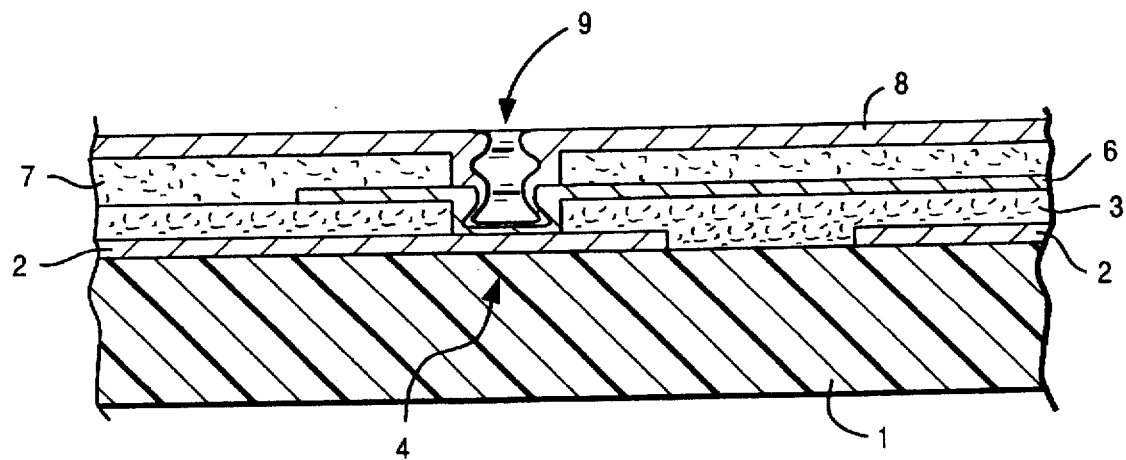
FIG. 1 is a schematic cross section of a conventionally formed stacked via structure using photoimageable dielectric layers.

FIG. 1 depicts by schematic cross section a stacked via structure formed in photoimageable dielectric layers according to the prior art. As shown, a base or core of epoxy filled cloth 1 has formed thereon a patterned copper layer 2. The front surface of the base structure is then coated with a photoimageable dielectric material 3, which in normal succession is exposed and developed to form a via opening at 4. An electrically conductive layer of copper or the like 6 is then plated and patterned to form an electrical connection to the underlying patterned copper layer 2. The process is then repeated using another photoimageable dielectric layer 7, again being photolithographically defined so as to open an area for the next level of the stacked via structure at 4. The plating of the stacked via follows as shown by conductive copper layer 8.

The problem with the prior art practice lies in the fact that with the second and successive stacked via layers the plating in the holes degrades. This is particularly apparent with the 0.12 millimeter or less diameter photoimage dielectric formed vias as aspect ratio increases with layer count. Namely, the electrical connection of the stacked via 9 between the first conductive layer 6 and the second conductive layer 8 is accomplished predominately at the bottom edge of the via opening as formed in dielectric layer 7. Note that the amount of metal plated into the recess of the first via is limited. Furthermore, the presence of the recess in via 9 leads to the retention of contaminates, whether those be residuals of photoimageable dielectric material, developer material, plating chemicals or other materials. Given this experience with photoimageable dielectric printed circuit board layering, the conventional practice has been to stagger the vias, in the manner described hereinbefore. The present invention eliminates this need for staggering.

FIG. 2 illustrates the first stage in a preferred practice of the invention. As shown in FIG. 2, a base or core laminate of multiple epoxy filled cloth layers 1 has formed on its front side 11 a pattern of electrically conductive copper 12 and on its backside 13 another patterned layer of copper 14. The cross section also shows the presence of a drilled hole at 16 extending through the base laminate as well as the copper layers. Hole 16 will be the foundation of one via that extends through the base laminate.

The next stage in the fabrication process is depicted by the cross section in FIG. 3A. As shown, a dry film 17 is vacuum laminated to the back side in conventional manner. A representative film photoresist is Dupont 4700 series. The hole at 16 is thereafter filled with conductive, plateable and solderable polymer 18, which is applied as a paste or liquid in conventional manner. A polymer which has the desirable characteristics and has a relatively matching thermal coefficient of expansion is PTF6300-4 available from W. R. Grace. This material is characterized in its having 70–80 percent copper fill. The polymer is then cured in the manner specified by the manufacturer. After the polymer is cured, dry film photoresist 17 is stripped.

The cross section depicted in 3B corresponds to that depicted in 3A, except that the walls of the hole at 16 through base laminate 1, as well as exposed copper on the front and back sides of the base laminate, have been plated in conventional manner with copper layer 19 to improve the conductivity of the via through the base laminate layer. Plated layer 19 is formed before polymer 21 is deposited and cured in the hole at 16. Though the plating introduces an additional manufacturing step, the copper layer on the walls of the hole improves the electrical conductivity of the via. The same dry film photoresist 22 is used for the configuration in FIG. 3B, likewise being stripped after the cure of polymer 21.

FIG. 4 illustrates by cross section a further stage in the fabrication process according to the present invention, where the selected structure proceeds from that depicted in FIG. 3A. To reach the stage depicted in FIG. 4, the structure in 3A is coated on the front and back sides with photoimageable dielectric material 23, which is photolithographically processed by exposure and development to form via openings at locations 24, 26, 27, 28 and 29. A preferred dielectric layer material is described in U.S. Pat. No. 5,300, 402, the subject matter which is incorporated herein by reference. Given the precision available with photolithographic processing, the holes in dielectric 23 at locations 24, 26, 27, 28 and 29 are nominally 0.12 millimeters or less in diameter. This is important in that the size and location accuracy of such vias preferably matches the pitch of solder ball arrays of flip-chip die.

To reach the stage of fabrication depicted by cross section in FIG. 5, the structure in FIG. 4 is plated and photolithographically patterned in conventional manner to form for deposits in the vias at locations 24, 26, 27, 28 and 29. The plating 31 extends from the surface of photoimageable dielectric 23 to the bottom of each via opening. Since conductive polymer 21 is plateable, an electrical connection is formed between the front side via at 26 and the backside via at 29. In keeping with the present invention, the recesses of via plating 31 are also filled with conductive, solderable and plateable polymer 32. Preferably, the polymer is the aforementioned PTF6300-4. The polymer formations are then cured in the manner specified by the manufacturer.

The stage of fabrication depicted in FIG. 6 is attained by coating the front and back sides of the structure in FIG. 5 with photoimageable dielectric, preferably the aforementioned material described in U.S. Pat. No. 5,300,402, followed by photolithographic exposure and development to define aligned openings at locations 24, 26, 27, 28 and 29.

Figure 7:
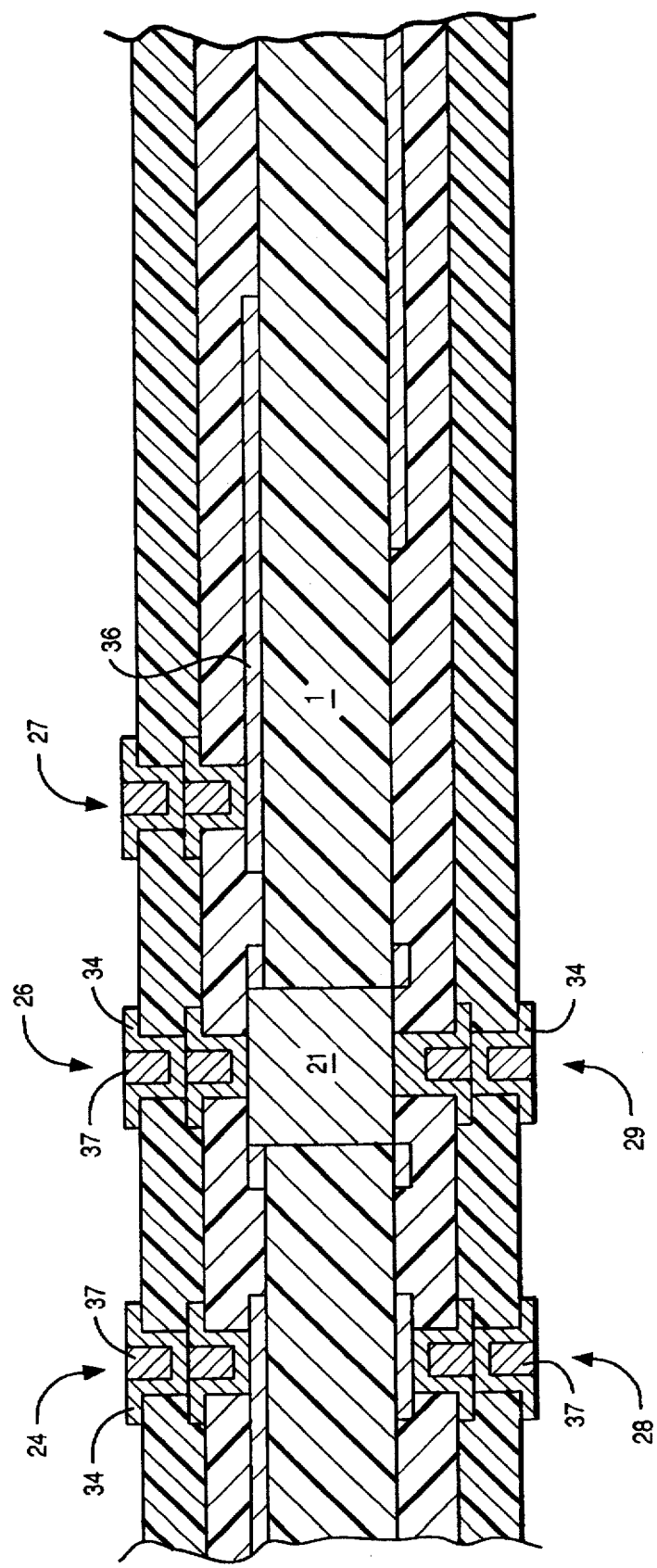

FIG. 7 depicts the structure following pattern plating and the polymer filling in the manner first described with reference to FIG. 5. The result, as shown in FIG. 7, is the presence of fine dimensioned and precisely located stacked vias at 24, 26, 27, 28 and 29. Direct and reliable electrical connection also exists from the upper surface to conductive patterns on the base laminate, such as the connection at location 27 to the base structure patterned copper layer 36. Note also that the complementary stacked vias structures at locations 26 and 29 provide a direct connection through the composite structure using the conductive polymer fill 21. Conductive polymer fill 37 in the recesses of the upper stacked via plating 34 facilitates direct solderable connection to various surface mounted electronic devices, such as the earlier noted flip-chip die.

Figure 8:
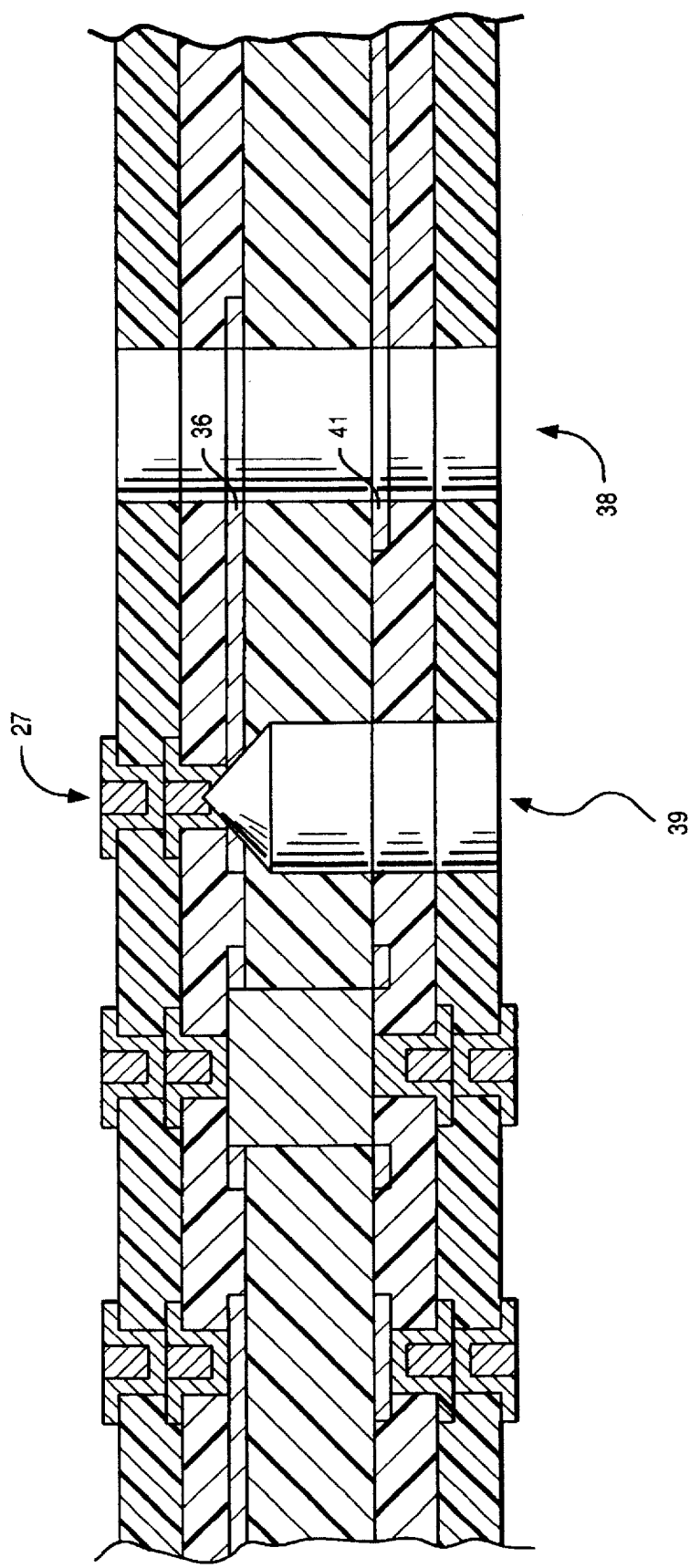
FIG. 8 schematically illustrates by schematic cross section the formation of different types of holes in the board structure in preparation for forming blind hole vies and plated through hole vies in the structure.
Figure 9:
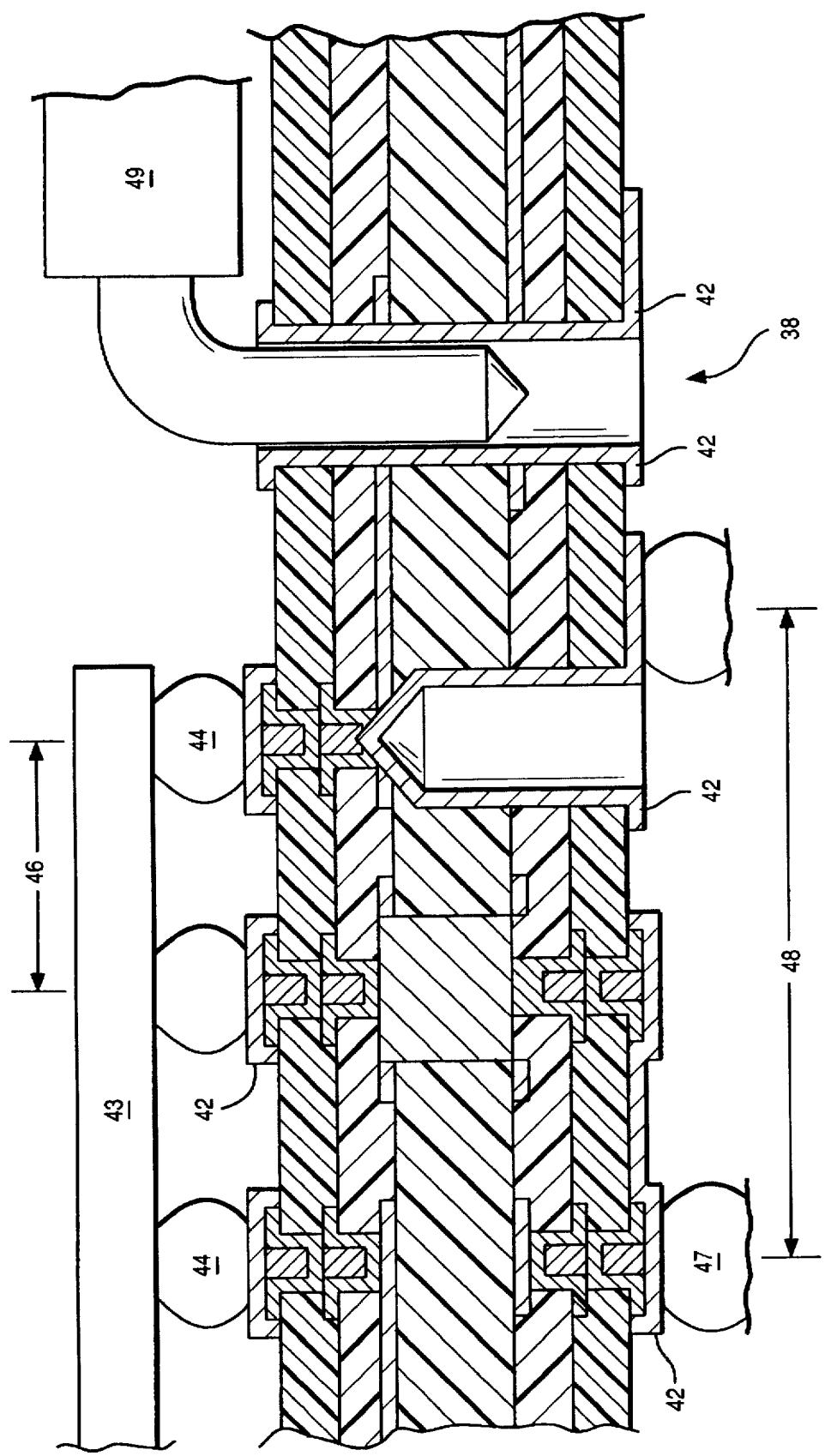
FIG. 9 depicts by schematic cross section a completed board structure with a mix of stacked vies, blind vies, plated through hole vies, including various implementations of stacked vias in photoimageable dielectric layers.

FIGS. 8 and 9 illustrate that the basic structure formed in FIG. 7 provides significant flexibility as to further fabrication. If blind via or plated through via holes are desired, the structure in FIG. 7 may be drilled as appropriate to produce the cross section depicted in FIG. 8. As shown in FIG. 8, a plated through hole via is to be formed at location 38 and a blind via is to be formed at location 39. The plated through hole via at 38 connects to front and back side base laminate conductive patterns 36 and 41, while the blind via hole drilled at 39 will provide connection from the back side of the base laminate to the stacked via at 27, as well as to base laminate conductor 36. Conventional plating and photolithographic processing forms the electrically conductive patterns of copper 42 in FIG. 9.

FIG. 9 illustrates the benefits of being able to provide fine dimensioned, precisely located stacked vies of reliable structure. The stacked vias provide minimum surface area interconnection between layers in the printed circuit board. The attributes provide for direct connection to a flip chip die, such as 43, which having solder balls 44 at fine pitch spacing 46. Furthermore, the stacked vies readily connect through the board to ball grid array patterned solder balls 47 of relatively larger spacing 48. Also, conventional pin in hole components 49 may be attached to plated through hole vias, such as at location 38. The combinations of structural elements depicted in FIG. 9 illustrates the flexibility of the present stacked via process in conjunction with the reliable connections it provides.

Figure 10:
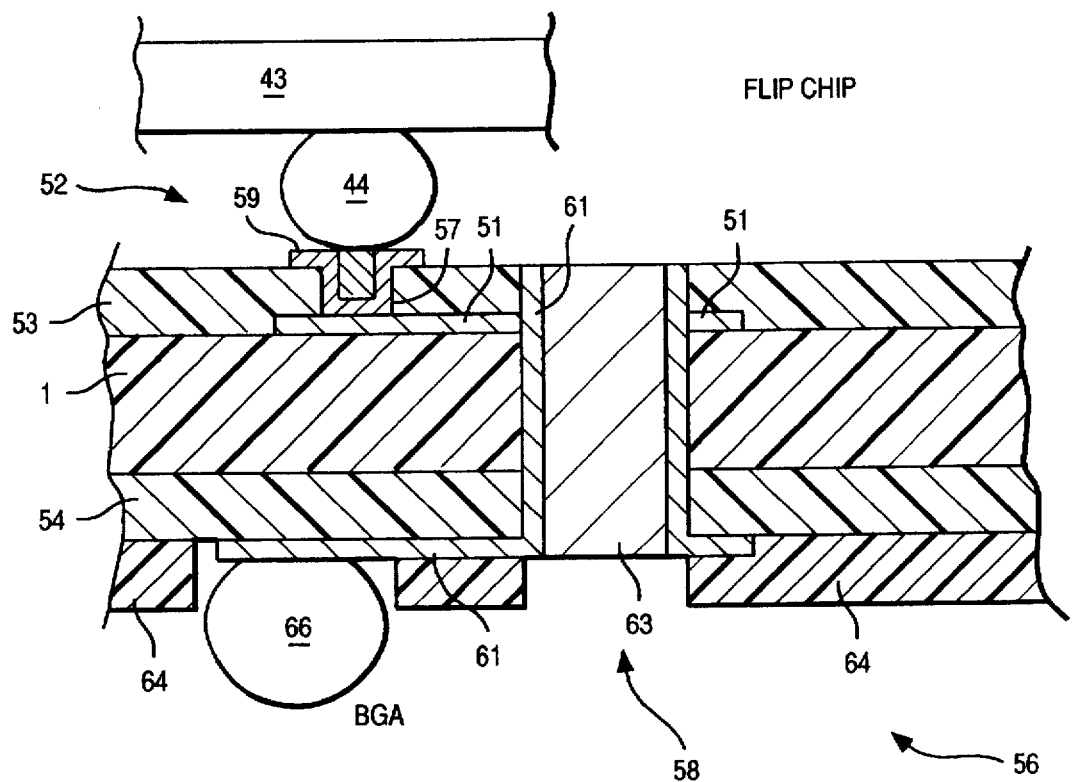
FIG. 10 is a schematic cross section of a chip carrier embodiment.

FIG. 10 illustrates by schematic cross section an efficient organic chip carrier embodiment of the present invention. An electrically conductive copper interconnect 51 is patterned on front side 52 of base laminate 1. Photoimageable polymer 53 and 54 is then formed on front side 52 and back side 56, the front side thereafter being photolithographically processed to form a via opening at 57. Hole 58 is drilled through the composite to intersect patterned layer 51. Copper plating follows to eventually form a conductive via pattern 59 and plated through hole pattern 61 extending onto polymer 54 of back side 56.

Etching of the plated copper to pattern via 59 and plated through hole 61 is preferably performed using an electrodeposited photoresist, such as PEPR 2400 commercially offered by Shipley Company, Inc. of Marlborough, Mass. This photoresist is conformally deposited so that it not only forms on the outer surfaces, but also coats plating 61 within hole 58 in a manner not attainable with film photoresists. Since electrodeposited photoresist is very uniform, thin, (nominally 7.5 micrometers) and exhibits good adhesion, it permits accurate patterning.

After pattern etching and a strip of the photoresist, conductive polymer 63 deposited and cured to planarize with conductive fill the recess in the contour of plated hole 58. A solder mask 64 may be added if desired.

Figure 11:
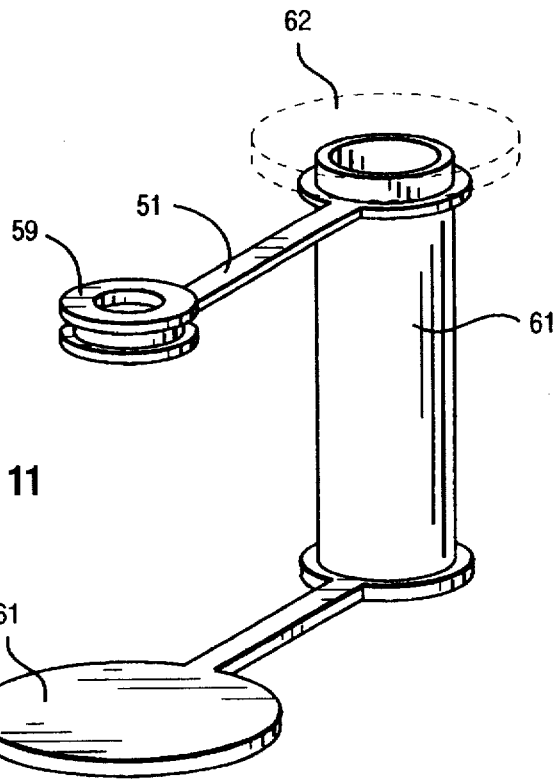
FIG. 11 schematically depicts the metallic structure of the electrical connection in the chip carrier of FIG. 10.

FIG. 11 depicts the electrically common metallic path from via metal 59 on the front side, through patterned base laminate conductor 61 to the land formed by plated conductor 61. Land 62, which normally results with the use of film photoresists, is eliminated when electrodeposited photoresist is used. This makes more surface area available for other interconnect wiring patterns.

FIG. 10 also illustrates the use of the carrier in connecting solder ball 44 of flip chip die 43 to ball grid array (BGA) solder ball 66 on the land portion of conductor 61.

Figure 12:
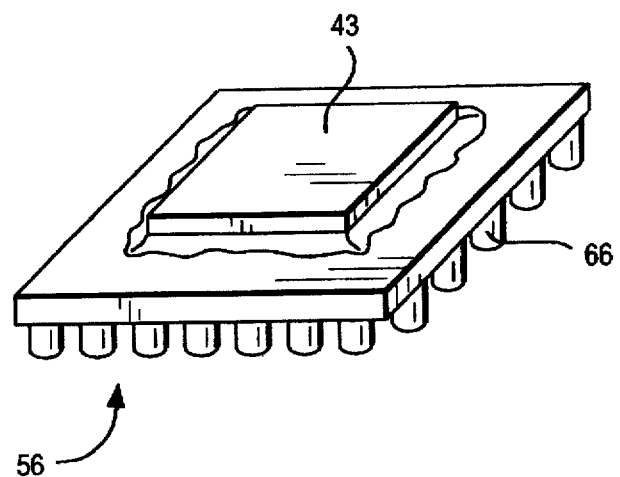
FIG. 12 schematically depicts the use of the carrier to interface a flip chip die to a ball grid array mounting structure.

FIG. 12 shows a completed carrier, including the epoxy encapsulated flip chip die on the front side and BGA pattern of solder balls 66 on back side 56.

Although the invention has been described and illustrated by way of specific embodiments, the apparatus and methods encompassed by the invention should be interpreted to be in keeping with the breadth of the claims set forth hereinafter.

We claim:

1. A method of manufacturing a multiple layer circuit board with stacked electrical interconnections, comprising the ordered steps of:

forming holes through a base laminate having a front side and a back side;

forming electrical interconnect patterns on the front and back sides of the base laminate adjacent the holes;

masking the holes from the front side of the base laminate;

filling the holes with a conductive polymer from the back side of the base laminate;

curing the conductive polymer to form conductive plugs through the holes;

forming a first dielectric layer on one of the front or back sides of the base laminate;

selectively removing regions of the first dielectric layer at selected number of the conductive plugs to form vias having openings through the first dielectric layer; the openings exposing the selected conductive plugs;

plating to form electrical connections through the openings of the vias at the selectively removed regions;

filling recesses produced by plating into the openings of the vias with conductive polymer; and curing the conductive polymer to form conductive plugs within the recesses at the filled vias.

2. The method recited in claim 1, wherein:

the first dielectric layer is photoresist; and the step of selective removal involves selective exposure and development.

3. The method recited in claim 2, comprising the further step of stripping the masking from the holes after curing the conductive polymer plugs in the holes.

4. The method recited in claim 3, wherein the cured polymer plugs are solderable.

5. The method recited in claim 4, wherein the step of masking of the holes is performed with photoresist.

6. A method of manufacturing a multiple layer circuit board with stacked vias, comprising the steps of:

forming a first electric interconnect pattern on the front side of a base laminate with a front side and a back side;

forming a first dielectric layer on the front side of the base laminate;

selectively removing regions of the first dielectric layer to form first vias exposing the electrical interconnect pattern at selected portions through the first dielectric layer;

plating to form electrical connections through the first vias at the selectively removed regions;

filling recesses produced by plating into the first vias with first conductive polymer;

curing the first conductive polymer to form first plugs within the recesses at the first vias;

forming a second dielectric layer on the front side of the base laminate;

selectively removing regions of the second dielectric layer to form second vias exposing selected number of the first plugs through the second dielectric layer;

plating to form electrical connections through the second vias at the selectively removed regions of the second dielectric;

filling recesses produced by plating into the second vias with second conductive polymer; and curing the second conductive polymer to form second plugs within the recesses at the second vias, wherein the second plugs are respectively aligned with and electrically connected to the underlying first plugs.

7. The method recited in claim 6, comprising the steps of:

forming a second electrical interconnect pattern on the back side of the base laminate;

forming a third dielectric layer on the back side of the base laminate;

selectively removing regions of the third dielectric layer to form third vias exposing second electrical interconnect pattern regions through the third dielectric layer;

plating to form electrical connections through third vias at selectively removed regions of the third dielectric;

filling recesses produced by plating into third vias with third conductive polymer; and curing the third conductive polymer to form third plugs within the recesses at the third vias.

8. The method recited in claim 6, wherein:

the first and second dielectric layers are photoresist; and the step of selectively removing first or second dielectric involves selective exposure and development.

9. The method recited in claim 8, wherein the first and second cured polymer plugs are solderable.

10. The method recited in claim 7, wherein the first, second and third cured polymer plugs are solderable.

* * * * *